United States Patent

Zhou

(10) Patent No.: US 9,404,987 B2
(45) Date of Patent: Aug. 2, 2016

(54) METHOD FOR CORRECTING IMAGE DISTORTION AND SYSTEM, AND MAGNETIC RESONANCE IMAGING EQUIPMENT

(71) Applicant: Kun Zhou, Shenzhen (CN)

(72) Inventor: Kun Zhou, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 642 days.

(21) Appl. No.: 13/872,292

(22) Filed: Apr. 29, 2013

(65) Prior Publication Data

US 2013/0285653 A1    Oct. 31, 2013

(30) Foreign Application Priority Data

Apr. 27, 2012   (CN) .......................... 2012 1 0127752

(51) Int. Cl.
  *G01R 33/565*   (2006.01)
  *G01R 33/563*   (2006.01)

(52) U.S. Cl.
  CPC .... *G01R 33/56572* (2013.01); *G01R 33/56341* (2013.01); *G01R 33/56518* (2013.01)

(58) Field of Classification Search
  CPC .................. G01R 33/56341; G01R 33/56572; G01R 33/56518
  See application file for complete search history.

(56) References Cited

U.S. PATENT DOCUMENTS

| 8,283,925 B2 * | 10/2012 | Auslender .............. A61B 5/055 324/309 |
| 8,548,217 B2 * | 10/2013 | Feiweier .......... G01R 33/56518 382/131 |

OTHER PUBLICATIONS

"Reduction of Eddy-Current-Induced Distortion in Diffusion MRI Using a Twice-Refocused Spin Echo," Reese et al., Magnetic Resonance in Medicine, vol. 49, pp. 177-182 (2003).
"Eddy Current Correction in Diffusion-Weighted Imaging Using Pairs of Images Acquired With Opposite Diffusion Gradient Polarity," Bodammer et al., Magnetic Resonance in Medicine, vol. 51, pp. 188-193 (2004).
"Correction for Distortion of Echo-Planar Images Used to Calculate the Apparent Diffusion Coefficient," Haselgrove et al., Magnetic Resonance in Medicine, vol. 36, pp. 960-964 (1996).
"Understanding Phase Maps in MRI: A New Cutline Phase Unwrapping Method," Chavez et al., IEEE Transactions on Medical Imaging, vol. 21, No. 8, pp. 966-977 (2002).
"Handbook of MRI Pulse Sequences," Bernstein et al., Chapter 9.1 and Chapter 5.5 (2004).

* cited by examiner

*Primary Examiner* — Dixomara Vargas
(74) *Attorney, Agent, or Firm* — Schiff Hardin LLP

(57) ABSTRACT

In a method for an apparatus correcting image distortion in diffusion-weighted echo-planar magnetic resonance imaging, a marker sequence is applied before a diffusion-weighted echo planar imaging sequence, to form a combined sequence. The combined sequence is used to obtain marked images with different preset b values and different preset diffusion directions. The diffusion-weighted echo planar imaging sequence is used to obtain diffusion-weighted echo planar images with the same b values and diffusion directions as the marked images. A stretching coefficient and a displacement coefficient are calculated for each image data column of the diffusion-weighted echo planar image. The stretching coefficient and displacement coefficient are used to correct the diffusion-weighted echo planar images.

8 Claims, 6 Drawing Sheets

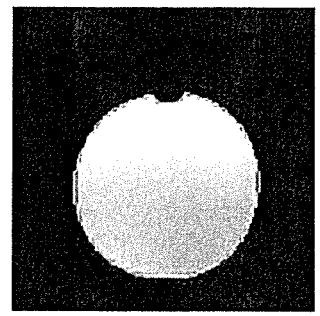
*Fig.9a*
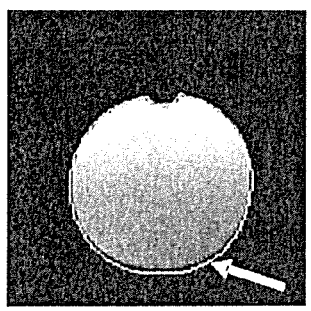 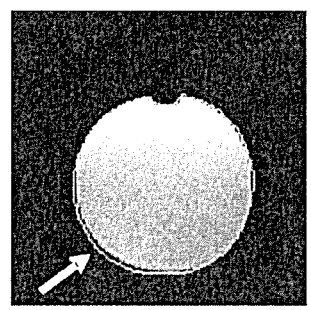 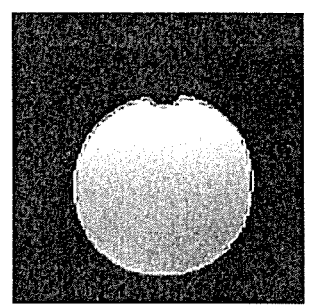
*Fig.9b*  *Fig.9c*  *Fig.9d*
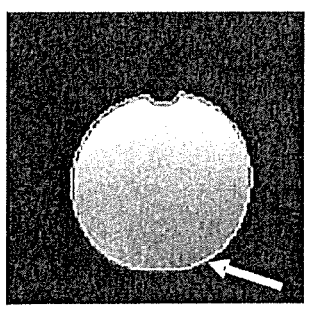 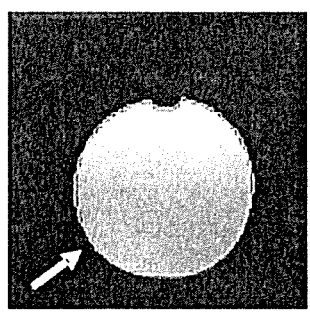 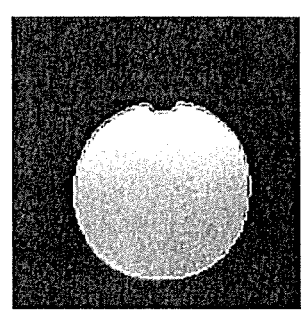
*Fig.9e*  *Fig.9f*  *Fig.9g*

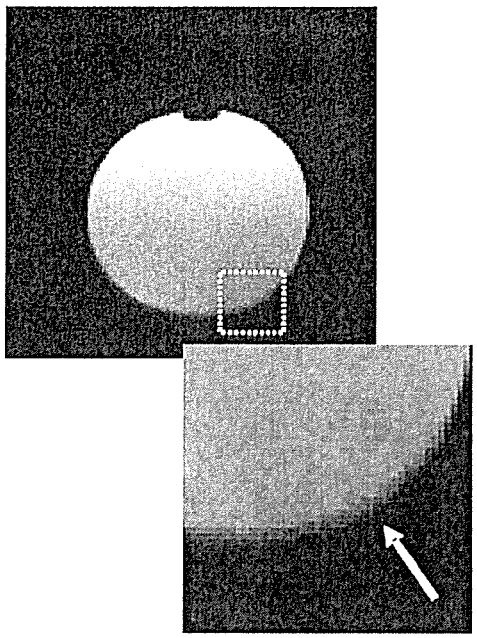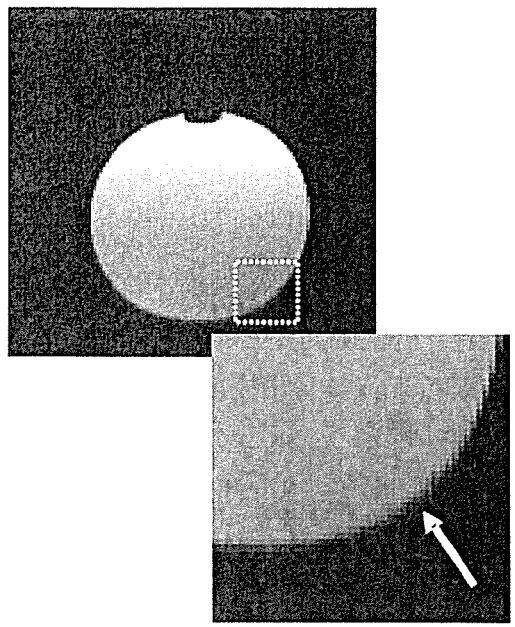
*Fig.10a*  *Fig.10b*
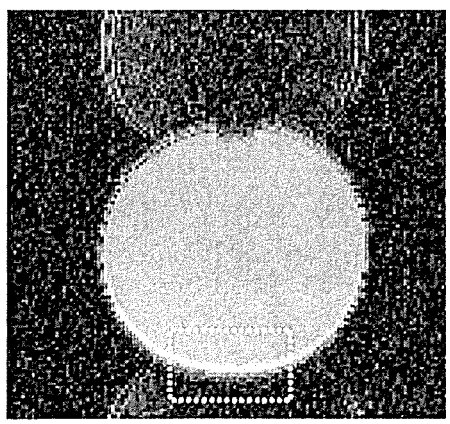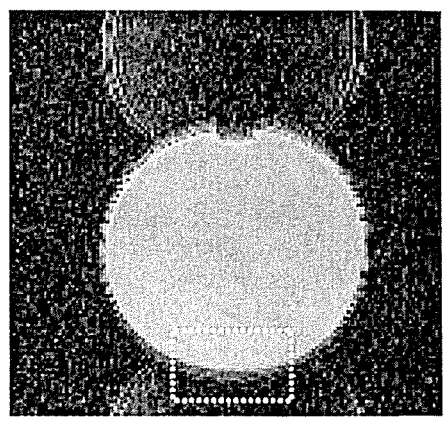
*Fig.11a*  *Fig.11b*

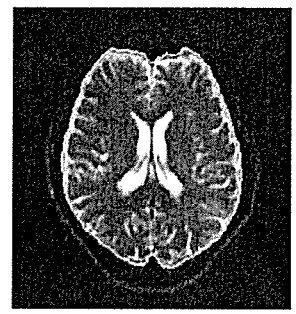
*Fig.12a*
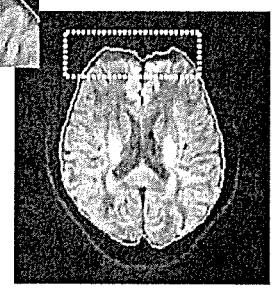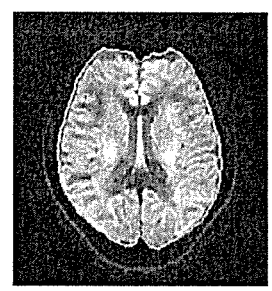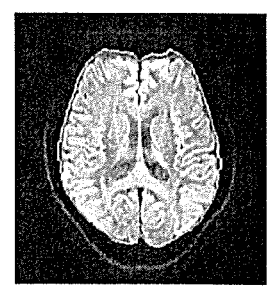
*Fig.12b*  *Fig.12c*  *Fig.12d*
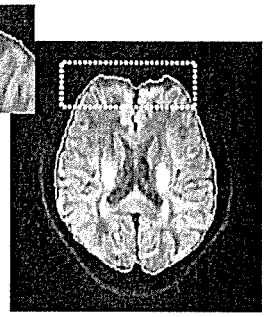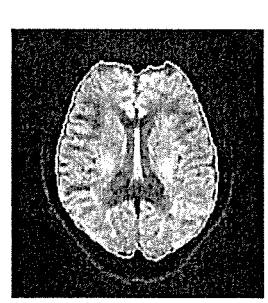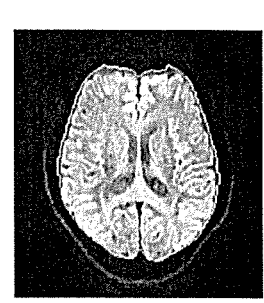
*Fig.12e*  *Fig.12f*  *Fig.12g*

METHOD FOR CORRECTING IMAGE DISTORTION AND SYSTEM, AND MAGNETIC RESONANCE IMAGING EQUIPMENT

BACKGROUND OF THE INVENTION

1. Field of the Invention

The present invention relates to the technical field of magnetic resonance imaging (MRI), and particularly to a method for correcting image distortion and system for diffusion-weighted echo planar imaging (DW-EPI) and magnetic resonance imaging equipment.

2. Description of the Prior Art

Diffusion imaging is a functional magnetic resonance imaging technology which has very high clinical importance, which can detect the biological properties of the diffusion of water molecules in human tissue and thus detect many pathologies which cannot be found by conventional medical imaging means. Diffusion imaging is usually implemented using an echo planar imaging (EPI) sequence; the imaging speed of the EPI sequence is very high but it is easily affected by various artifacts, especially image distortion.

Diffusion-weighted imaging (DWI) is an important imaging method of diffusion imaging, which is usually implemented using a DW-EPI sequence, and the DW-EPI sequence usually realizes diffusion weight by adding a diffusion gradient into the EPI sequence. The diffusion gradient of the DW-EPI sequence will introduce an eddy current field into the imaging space, and the additional magnetic field of eddy current field causes image distortion.

Since it is usually required to acquire several single images with different diffusion directions and diffusion weights (i.e. DW-EPI images) in diffusion-weighted imaging, and different diffusion gradients are used, causing different eddy current distributions, the distortion degrees and types of these single images are not completely identical. The appearance of the image distortion not only depends on the magnitude of the gradient, i.e. the diffusion weight, but also depends on the direction of the gradient. The size of the diffusion weight is usually determined through a so-called "b value", and an image with the b value being zero usually does not have distortion, and an image with the b value not being zero has distortion. Hence, these single images with different b values and different diffusion directions do not overlap, and if these single images are combined with each other and calculated without correction to generate isotropic DWIs and apparent diffusion coefficient (ADC) graphs and the like required in diagnosis, this will cause blurs in the DWI and errors in the calculation of the ADC graphs, and the like.

Means for suppressing the eddy current field includes pre-enhancement of gradient coils and gradient pulses using self-shielding. Self-shielding coils include a main coil and a shielding coil, wherein the direction of the magnetic field generated by the shielding coil during imaging is opposite to that of the main coil, and as specially designed, this pair of coils can generate the required gradient magnetic field within an imaging area, and the magnetic field outside the imaging area is as approximate to zero as possible, which reduces the eddy current field essentially. The pre-enhancement technology is to counteract the influence of the eddy current field by changing the shape of the gradient waveform. These methods can be used to effectively reduce but cannot completely eliminate the influence of the eddy current field. The DW-EPI sequence is very sensitive to the eddy current field, and in order to improve the imaging quality, a special method is needed.

SUMMARY OF THE INVENTION

An object of the present invention is to provide a method for correcting image distortion in DW-EPI, and a system for correcting image distortion in DW-EPI, and a system for correcting image distortion in DW-EPI, for improving the image quality of magnetic resonance imaging. The present invention will also propose magnetic resonance imaging equipment.

Therefore, the present invention provides a method for correcting image distortion in diffusion-weighted echo planar imaging, comprising:

utilizing a combined sequence for acquisition to obtain a plurality of marked images with different preset b values and different preset diffusion directions, wherein the combined sequence comprises a diffusion-weighted echo planar imaging sequence and a marker sequence applied before the same; and utilizing the diffusion-weighted echo planar imaging sequence for acquisition to obtain a plurality of diffusion-weighted echo planar images with the same b values and diffusion directions as the marked images;

subtracting each of the marked images from the diffusion-weighted echo planar images having the same b values and the same diffusion directions to obtain a marker image corresponding to each of the diffusion-weighted echo planar images, wherein a marker image with the b value being zero is a reference marker image, and a marker image with the b value not being zero is a distortion marker image; and for each diffusion-weighted echo planar image with the b value not being zero, utilizing a distortion marker image having the same b value and the same diffusion direction as the diffusion-weighted echo planar image and a reference marker image corresponding to the diffusion-weighted echo planar image to calculate a stretching coefficient and a displacement coefficient corresponding to each image data column of the diffusion-weighted echo planar image, and utilizing the stretching coefficient and displacement coefficient to correct the diffusion-weighted echo planar image.

Optionally, calculating a stretching coefficient and a displacement coefficient corresponding to each image data column of the diffusion-weighted echo planar image comprises:

selecting a plurality of distorted image data columns from the distortion marker image, and for each of the selected distorted image data columns, selecting a reference image data column in a corresponding position from the reference marker image; or, selecting a plurality of reference image data columns from the reference marker image, and for each of the selected reference image data columns, selecting a distorted image data column in a corresponding position from the distortion marker image;

for the currently selected reference image data column and the corresponding distorted image data column thereof, determining the position of a wave peak immediately adjacent to one side of the highest peak in a Fourier transform spectrum curve of the reference image data column, performing position fitting on the wave peak, and taking the peak value position of the fitted wave peak as a reference marker frequency; and determining the position of a wave peak immediately adjacent to one side of the highest peak in a Fourier transform spectrum curve of the distorted image data column, performing position fitting on the wave peak, and taking the peak value position of the fitted wave peak as a distortion marker frequency;

taking the ratio between the distortion marker frequency and the reference marker frequency as the stretching coefficient of the current distorted image data column relative to the current reference image data column;

utilizing the stretching coefficient to correct the distorted image data column, successively displacing the corrected distorted image data column in a preset direction according to a preset displacement interval, calculating a relevance value between the distorted image data column and the reference image data column after each displacement, and taking the displacement amount corresponding to the maximum relevance value as the displacement coefficient of the current distorted image data column relative to the current reference image data column; and after calculating stretching coefficients and displacement coefficients corresponding to a plurality of distorted image data columns, respectively performing linear fitting and extrapolation on a plurality of stretching coefficients and a plurality of displacement coefficients to obtain the stretching coefficient and the displacement coefficient corresponding to each distorted image data column of the entire distortion marker image, as a stretching coefficient and a displacement coefficient corresponding to each image data column of the diffusion-weighted echo planar image.

Optionally, selecting a plurality of distorted image data columns from the distortion marker image comprises: successively extracting each image data column in the distortion marker image, for the currently extracted image data column, calculating a Fourier transform spectrum curve of the image data column, and if the ratio between the peak value of the highest peak and the peak value of a wave peak on one side of the highest peak in the spectrum curve is greater than a preset selection threshold value, then selecting the currently extracted image data column as a distorted image data column. Selecting a plurality of reference image data columns from the reference marker image comprises: successively extracting each image data column in the reference marker image, for the currently extracted image data column, calculating a Fourier transform spectrum curve of the image data column, and if the ratio between the peak value of the highest peak in the spectrum curve and the peak value of a wave peak on one side of the highest peak is greater than a preset selection threshold value, then selecting the currently extracted image data column as a reference image data column.

The present invention also provides a system for correcting image distortion in diffusion-weighted echo planar imaging, comprising:

an image acquisition unit for utilizing a combined sequence for acquisition to obtain a plurality of marked images with different preset b values and different preset diffusion directions, wherein the combined sequence comprises a diffusion-weighted echo planar imaging sequence and a marker sequence applied before the same; and utilizing the diffusion-weighted echo planar imaging sequence for acquisition to obtain a plurality of diffusion-weighted echo planar images with the same b values and diffusion directions as the marked images;

a marker image generation unit for subtracting each of the marked images from the diffusion-weighted echo planar images having the same b values and the same diffusion directions to obtain a marked image corresponding to each of the diffusion-weighted echo planar images, wherein a marker image with the b value being zero is a reference marker image, and a marker image with the b value not being zero is a distortion marker image;

a distortion coefficient calculation unit for, regarding a current diffusion-weighted echo planar image in various diffusion-weighted echo planar images with the b value not being zero, utilizing a distortion marker image having the same b value and the same diffusion direction as the current diffusion-weighted echo planar image and a reference marker image corresponding to the current diffusion-weighted echo planar image to calculate a stretching coefficient and a displacement coefficient corresponding to each image data column of the current diffusion-weighted echo planar image; and an image correction unit for utilizing the stretching coefficient and displacement coefficient corresponding to each image data column of the current diffusion-weighted echo planar image obtained by the distortion coefficient calculation unit to correct the current diffusion-weighted echo planar image.

Optionally, the distortion coefficient calculation unit includes:

an image data column selection subunit for selecting a plurality of distorted image data columns from the distortion marker image corresponding to the current diffusion-weighted echo planar image, and for each of the distorted image data columns selected, selecting a reference image data column in a corresponding position from the reference marker image; or, selecting a plurality of reference image data columns from the reference marker image, and for each of the selected reference image data columns, selecting a distorted image data column in a corresponding position from the distortion marker image;

a marker frequency determination subunit for, regarding the current reference image data column selected by the image data column selection subunit and the corresponding current distorted image data column thereof, determining the position of a wave peak immediately adjacent to one side of the highest peak in a Fourier transform spectrum curve of the current reference image data column, performing position fitting on the wave peak, and taking the peak value position of the fitted wave peak as a reference marker frequency; and determining the position of a wave peak immediately adjacent to one side of the highest peak in a Fourier transform spectrum curve of the current distorted image data column, performing position fitting on the wave peak, and taking the peak value position of the fitted wave peak as a distortion marker frequency;

a stretching coefficient calculation subunit for taking the ratio between the distortion marker frequency and the reference marker frequency determined by the marker frequency determination subunit as a stretching coefficient of the current distorted image data column relative to the current reference image data column;

a displacement coefficient calculation subunit for utilizing the stretching coefficient calculated by the stretching coefficient calculation subunit to correct the current distorted image data column, successively displacing the corrected current distorted image data column in a preset direction according to a preset displacement interval, calculating a relevance value between the current distorted image data column and the current reference image data column after each displacement, and taking the displacement amount corresponding to the maximum relevance value as a displacement coefficient of the current distorted image data column relative to the current reference image data column; and a distortion coefficient fitting subunit for respectively performing, after the stretching coefficient calculation subunit and the displacement coefficient calculation subunit calculate stretching coefficients and displacement coefficients corresponding to a plurality of distorted image data columns, linear fitting and extrapolation on a plurality of stretching coefficients and a plurality of displacement coefficients to obtain the stretching coefficient and the displacement coefficient corresponding to each distorted image data column of the entire distortion marker image, as a stretching coefficient and a displacement coefficient corresponding to each image data column of the diffusion-weighted echo planar image.

Optionally, the image data column selection subunit successively extracts each image data column in the distortion marker image, and for the currently extracted image data column, calculates a Fourier transform spectrum curve of the image data column, and if the ratio between the peak value of the highest peak and the peak value of a wave peak on one side of the highest peak in the spectrum curve is greater than a preset selection threshold value, then selects the currently extracted image data column as a distorted image data column. Alternatively, the image data column selection subunit successively extracts each image data column in the reference marker image, and for the currently extracted image data column, calculates a Fourier transform spectrum curve of the image data column, and if the ratio between the peak value of the highest peak and the peak value of a wave peak on one side of the highest peak in the spectrum curve is greater than a preset selection threshold value, then selects the currently extracted image data column as a reference image data column.

Optionally, the system further comprises: a sequence combination unit for applying a marker sequence before a diffusion-weighted echo planar imaging sequence to construct a combined sequence.

Optionally, the system further comprises: a processor and a computer readable storage medium; wherein any one of the sequence combination unit, the marker image generation unit, the distortion coefficient calculation unit and the image correction unit, or any combination thereof is program code stored in the computer readable storage medium; and the processor is used for executing the program code in the computer readable storage medium.

The present invention also provides magnetic resonance imaging equipment comprising a system for correcting image distortion in diffusion-weighted echo planar imaging as described above.

It can be seen from the abovementioned solution that, in the embodiments of the present invention, a combined sequence constructed from a marker sequence and a DW-EPI sequence is utilized for acquisition to obtain a marked image, and it is subtracted from a normally collected image to obtain a purely marker image; then a reference marker image and a distortion marker image corresponding to a normally collected image with the b value not being zero are utilized to calculate a distortion coefficient of the normally collected image with the b value not being zero, and then this distortion coefficient is utilized to correct the normally collected image with the b value not being zero, which can effectively correct the image distortion introduced by eddy current.

In addition, in the embodiments of the present invention, using a column as a unit, a plurality of reference image data columns are selected from the reference marker image, a plurality of distorted image data columns in corresponding positions are selected from the distortion marker image, the image distortion caused by the eddy current field are displaced as a whole, the shearing and stretching deformation are converted to merely two kinds of deformations, i.e. displacement and stretching, and the deformation of the entire distortion marker image relative to the reference marker image is determined by calculating a stretching coefficient and a displacement coefficient of a distorted image data column relative to a reference image data column, which simplifies the whole calculation process.

BRIEF DESCRIPTION OF THE DRAWINGS

FIG. 6a is a schematic diagram of a reference marker image and a distortion marker image corresponding thereto in the embodiments of the present invention.

FIG. 6b is a schematic diagram of a one-dimensional curve of an image data column corresponding to the dashed line in FIG. 6a.

FIG. 6c is a schematic diagram of a Fourier transform spectrum curve of the reference image data column and a Fourier transform spectrum curve of the distorted image data column as shown in FIG. 6a in the embodiments of the present invention.

FIG. 6d is a schematic diagram of the fitting of a wave peak in the region shown in the small box on the spectrum curve as shown in FIG. 6c in the embodiments of the present invention.

FIGS. 9a to 9g are schematic drawings of distortion correction of an image with b=1000 in example I in the present invention. FIG. 9a is an image with b=0; FIGS. 9b to 9d are images with b=1000 in three different diffusion directions; FIGS. 9e to 9g are images after image correction in the diffusion directions in FIGS. 9b to 9d.

FIGS. 10a and 10b are schematic drawings of the correction of an isotropic diffusion-weighted image when the b value is 1000 in the present example. FIG. 10a is an isotropic DW-EPI image obtained through calculation using the originally collected single DW-EPI images as shown in FIGS. 9b to 9d, and FIG. 10b is an isotropic diffusion-weighted image obtained through calculation using the corrected single DW-EPI images as shown in FIGS. 9e to 9g.

FIGS. 11a and 11b are schematic drawings of the effects of generating an ADC based on a DW-EPI image before correction and after correction when the b value is 1000.

FIGS. 12a to 12g are schematic drawings of distortion correction of an image with b=1000 in example II in the present invention. FIG. 12a is an image with b=0;

FIGS. 12b to 12d are images with b=1000 in three different diffusion directions; FIGS. 12e to 12g are images after image correction in each diffusion direction in FIGS. 12b to 12d.

DESCRIPTION OF THE PREFERRED EMBODIMENTS

Figures 1A, 1B:
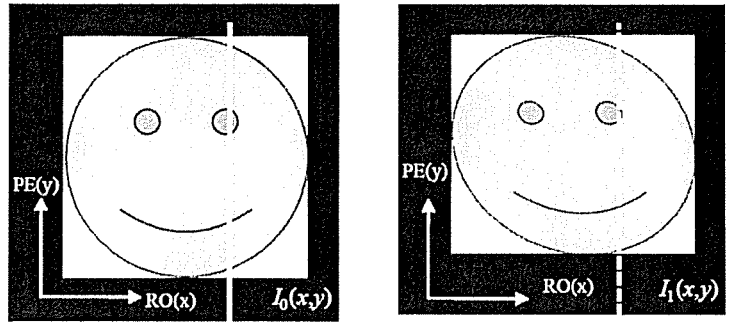
FIGS. 1a and 1b are schematic drawings of a DW-EPI image with the b value being zero and a DW-EPI image with the b value not being zero in the embodiments of the present invention.

In the drawings, the reference numerals are as follows:
201—Constructing a combined sequence
202—Acquiring a marked image and a normal DW-EPI image
203—Obtaining a marker image
204—Obtaining a distortion coefficient of a corresponding DW-EPI image according to a reference marker image and a distortion marker image, and performing image correction using the distortion coefficient.
501—Selecting a distorted image data column and a reference image data column
502—Calculating a corresponding distortion marker frequency and a reference marker frequency according to the selected image data columns
503—Calculating a stretching coefficient
504—Calculating a displacement coefficient
505—Performing linear fitting and extrapolation on a plurality of stretching coefficients and a plurality of displacement coefficients to obtain the distortion coefficients of all the image data columns
701—Sequence combination unit
702—Image acquisition unit
703—Marker image generation unit
704—Distortion coefficient calculation unit
705—Image correction unit
801—Image data column selection subunit
802—Marker frequency determination subunit
803—Stretching coefficient calculation subunit
804—Displacement coefficient calculation subunit
805—Distortion coefficient fitting subunit

PARTICULAR EMBODIMENTS

Hereinafter, the distortion type of a single DW-EPI image will be analyzed as follows:

in an EPI sequence, the image distortion caused by an additional magnetic field $\Delta B$ in the direction of frequency coding and in the direction of phase coding can be expressed as equation (1) and equation (2) respectively:

$$\Delta x(x, y) = \frac{\Delta B(x, y)}{G_x} \quad (1)$$

$$\Delta y(x, y) = \frac{\Delta B(x, y) t_{esp}}{\overline{G_y} \tau} \quad (2)$$

wherein x is the coordinate in the direction of frequency coding, y is the coordinate in the direction of phase coding; $G_x$ is the frequency coding gradient, $\overline{G_y}$ is the average value of phase coding gradients; $\tau$ is the duration of the phase coding gradient; and $t_{esp}$, is the echo distance.

In practical applications, since the deformation in the direction of frequency coding is usually so small that it can be neglected, generally only the deformation in the direction of phase coding is taken into account.

The eddy current field introduced by the diffusion gradient of the DW-EPI sequence is a main source of the additional magnetic field $\Delta B$, which causes image distortion. $B_e(\vec{r},t)$ represents the component of the eddy current field in the direction of main magnetic field B0, and then it can be expanded as shown in equation (3):

$$B_e(\vec{r},t) = b_0(t) + \vec{r} \cdot \vec{g}(t) + \ldots \quad (3)$$

wherein the first item $b_0(t)$ is irrelevant to spatial positions, and it is usually referred to as a zero order item. The second item is a linear item, or referred to as a first order item, $\vec{r}$ is a vector coordinate, the components thereof being x, y, and z, and correspondingly, the components of the vector gradient $\vec{g}(t)$ are $g_x$, $g_y$ and $g_z$, which represent the gradient of the eddy current field in three directions of x, y and z respectively. Higher order items are usually not taken into account. z is a coordinate in the direction of slice selective gradient. Since the z component in the linear item will cause imperfect back-focusing of slice selective phases, which decreases the overall signal intensity of the image but would not cause image distortion, it is only required to take the x and y components in the zero order item and the first order item into consideration in the embodiments of the present invention, and equation (3) can be rewritten as equation (4):

$$B_e(x,y) = b_0 + x \cdot g_x + y \cdot g_y \quad (4)$$

Equation (4) can be substituted into the image distortion expression in equation (2) to obtain an expression of the image distortion caused by the eddy current field:

$$\Delta y(x, y) = B_e(x, y) t_{esp}/\overline{G_y}\tau \quad (5)$$
$$= (b_0 + x \cdot g_x + y \cdot g_y) \cdot t_{esp}/\overline{G_y}\tau$$

It can be seen from the above equation that the zero order eddy current field will cause overall displacement of the image, the first order item in the direction of frequency coding will cause the shearing deformation of the image, and the first order item in the direction of phase coding will cause stretching deformation of the image.

To this end, in the embodiments of the present invention, a single DW-EPI can be corrected with respect to the deformation type.

For simpler implementation, in the embodiments of the present invention, for each single DW-EPI image, each single column of image data therein is taken as a unit to correct the scaling and displacement. $I_0(x, y)$ represents a DW-EPI image with the b value being zero, and $I_1(x,y)$ represent a DW-EPI image with the b value not being zero, which are respectively as shown in FIGS. 1a and 1b. x is the direction of frequency coding, and y is the direction of phase coding. $I_0(x)$ and $I_1(x)$ are respectively used to represent an image data column in the direction of phase coding in a DW-EPI image, which are respectively shown by the solid line and dashed line in FIGS. 1a and 1b, and according to the foregoing analysis, the image distortion caused by the eddy current field includes overall displacement, shearing and stretching. When it is considered in a column by column manner, there are only two kinds of deformations, i.e. displacement and stretching, and $I_1(x)$ can be aligned with $I_0(x)$ by merely performing proper stretching and displacement:

$$I_0(x) = S(x) \cdot I_1(x) + T(x) \quad (6)$$

wherein S(x) and T(x) respectively represent the stretching coefficient and displacement coefficient of the x-th image data column.

In order to calculate the stretching coefficient and displacement coefficient of each image data column, in the embodiments of the present invention, it is conceivable to use a marker image to calculate the stretching coefficient and displacement coefficient of each image data column of a DW-EPI image corresponding to the marker image.

In order to make the object, technical solutions and advantages of the present invention clearer, the present invention will be further described in detail hereinafter by way of embodiments.

Figure 2:
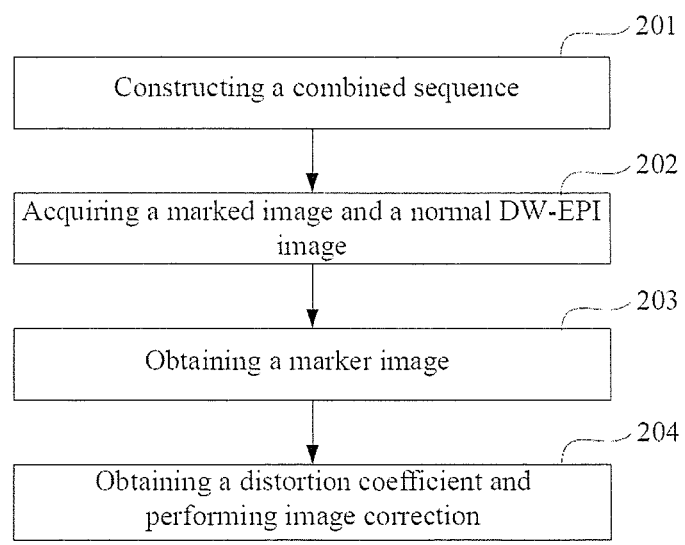
FIG. 2 is an exemplary flowchart of a method for correcting image distortion for DW-EPI imaging in the embodiments of the present invention.

FIG. 2 is an exemplary flowchart of the method for correcting image distortion for DW-EPI imaging in the embodiments of the present invention. As shown in FIG. 2, the method comprises the following steps:

step 201, a marker sequence is applied before a DW-EPI sequence to construct a combined sequence.

Figure 3:
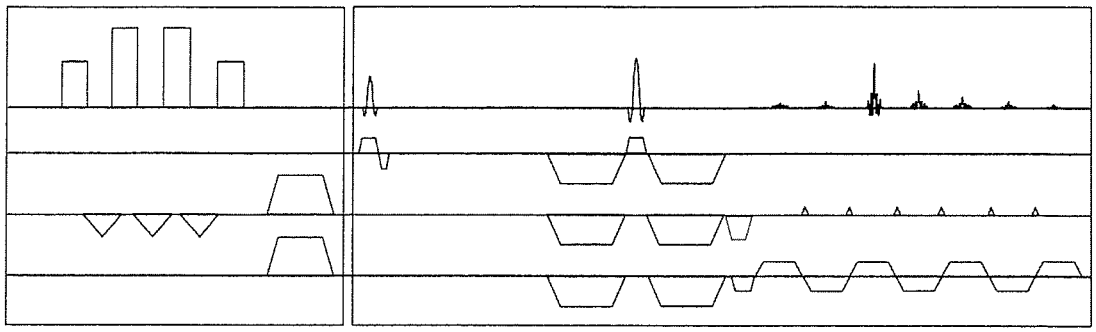
FIG. 3 is a schematic diagram of a combined sequence in the embodiments of the present invention.

As shown in FIG. 3, FIG. 3 is a schematic diagram of a combined sequence in the embodiments of the present invention, wherein the left side of FIG. 3 is a marker sequence, and the right side is a DW-EPI sequence.

Since deformations mainly appear in the direction of phase coding, in this embodiment, a mark which only has a straight line in the direction of phase coding can be used.

Step 202, the combined sequence is utilized for acquisition to obtain a plurality of marked images with different preset b values and different preset diffusion directions; and the DW-EPI sequence is utilized for acquisition to obtain a plurality of DW-EPI images with the same b values and diffusion directions as the marked images.

Figures 4A, 4B, 4C:
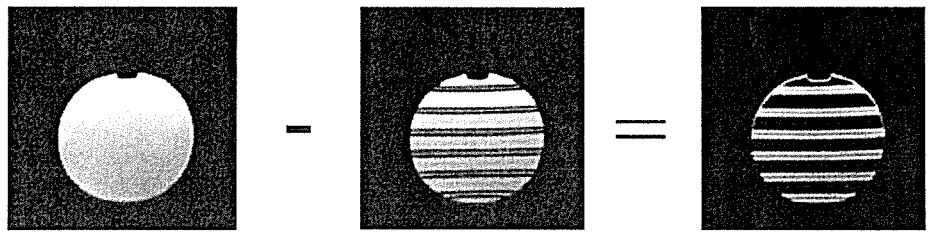
FIGS. 4a and 4b are schematic drawings of a DW-EPI image and a marked image respectively.
FIG. 4c is a schematic drawing of a marker image.

FIGS. 4a and 4b respectively show a DW-EPI image and a marked image in the embodiments of the present invention, and both of them have the same b value and the same diffusion direction.

Step 203, each of the marked images are subtracted from the DW-EPI images having the same b value and the same diffusion directions to obtain a marker image corresponding to each DW-EPI image. A marker image with the b value being zero can be referred to as a reference marker image, and a marker image with the b value not being zero can be referred to as a distortion marker image.

FIG. 4c shows a marker image in the embodiments of the present invention. The marker image is a marker image obtained after the subtraction of the marked image shown in FIG. 4b from the DW-EPI image shown in FIG. 4a.

Step 204, for each DW-EPI image with the b value not being zero, a distortion marker image having the same b value and the same diffusion direction as the DW-EPI image and a reference marker image corresponding to the DW-EPI image are utilized to calculate a stretching coefficient and a displacement coefficient corresponding to each image data column of the DW-EPI image, and the stretching coefficient and displacement coefficient are utilized to correct the DW-EPI image.

In this step, there can be many implementations to utilize the distortion marker image having the same b value and the same diffusion direction as the DW-EPI image and the reference marker image corresponding to the DW-EPI image to calculate the stretching coefficient and the displacement coefficient corresponding to each image data column of the DW-EPI image.

Figure 5:
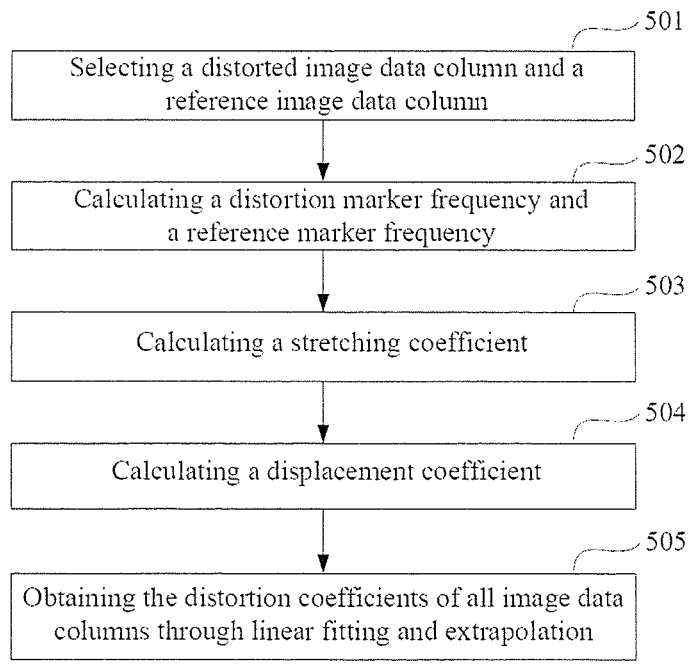
FIG. 5 is a flowchart of the method for calculating the stretching coefficient and the displacement coefficient corresponding to each image data column of a DW-EPI image according to a reference marker image and a distortion marker image in the embodiments of the present invention.

FIG. 5 shows a particular implementation method thereof, and as shown in FIG. 5, the method includes the following steps:

step 501, a plurality of distorted image data columns are selected from the distortion marker image, and for each selected distorted image data column, a reference image data column is selected from a corresponding position in the reference marker image.

In particular implementation, in this embodiment, it is unnecessary to calculate distortion coefficients (i.e. stretching coefficient and displacement coefficient) for all the image data columns of the distortion marker image, since if a certain image data column only contains background noise without image, such a calculation is obviously meaningless. Furthermore, several image data columns close to the edge are also excluded, since these image data columns have few images, and significant errors will be introduced if they are used for calculating the displacement coefficient and the stretching coefficient. Therefore, in this step, several image data columns can be selected to calculate the distortion coefficient.

Figures 6A, 6B, 6C, 6D:
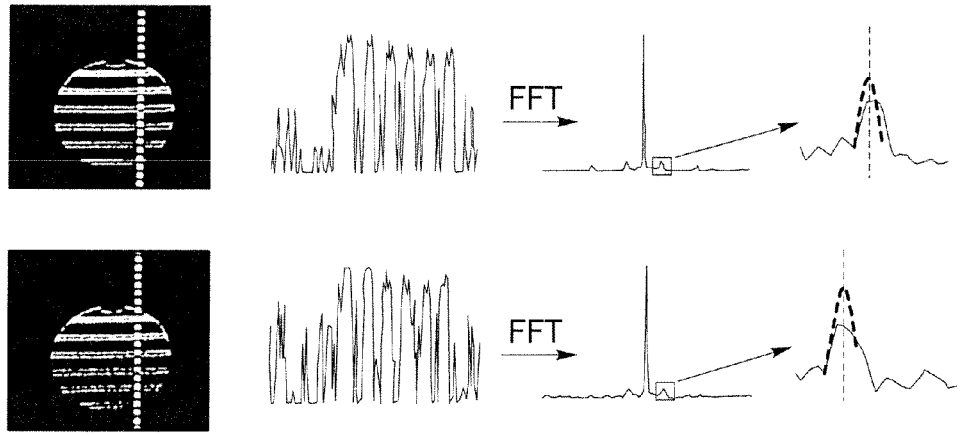

FIG. 6a shows a reference marker image and a corresponding distortion marker image thereof in the embodiments of the present invention, wherein the upper image is a reference marker image, and the lower image is a distortion marker image. The position corresponding to the dashed line in the reference marker image is a selected reference image data column, and the position corresponding to the dashed line in the distortion marker image is a selected distorted image data column. FIG. 6b is a schematic diagram of a one dimensional curve of an image data column corresponding to the dashed line in FIG. 6a.

In particular implementation, in this step, each image data column in the distortion marker image can be extracted successively, and for a currently extracted image data column, a Fourier transform spectrum curve of the image data column is obtained through calculation; and as shown in FIG. 6c, the lower curve in FIG. 6c is a Fourier transform spectrum curve of the image data column shown by the dashed line in the lower distortion marker image in FIG. 6a. If the ratio between the peak value of the highest peak and the peak value of a wave peak (such as the wave peak in the region shown in the small box on the lower curve in FIG. 6c) on one side of the highest peak in the spectrum curve is greater than a preset selection threshold value, then the currently extracted image data column is selected as a distorted image data column.

Alternatively, in particular implementation, in this step, several image data columns in the middle region of the distortion marker image can be selected directly as distorted image data columns.

In this step, of course, a plurality of reference image data columns can also be selected from the reference marker image, and for each selected reference image data column, a distorted image data column is selected from a corresponding position in the distortion marker image. In particular implementation, the image data column selection subunit successively extracts each image data column in the reference marker image, and for the currently extracted image data column, calculates a Fourier transform spectrum curve of the image data column, and if the ratio between the peak value of the highest peak and the peak value of a wave peak on one side of the highest peak in the spectrum curve is greater than a preset selection threshold value, then selects the currently extracted image data column as a reference image data column. Alternatively, several image data columns in the middle region of the reference marker image can be selected directly as reference image data columns.

Step 502, for the currently selected reference image data column and the corresponding distorted image data column thereof, the position of a wave peak immediately adjacent to one side of the highest peak is determined in the Fourier transform spectrum curve of the reference image data column, position fitting is performed on the wave peak, and the peak value position of the fitted wave peak is taken as a reference marker frequency; and the position of a wave peak immediately adjacent to one side of the highest peak is determined in the Fourier transform spectrum curve of the distorted image data column, position fitting is performed on the wave peak, and the peak value position of the fitted wave peak is taken as a distortion marker frequency.

Still taking the reference image data column and the corresponding distorted image data column shown in FIG. 6a as an example, the Fourier transform spectrum curve of the reference image data column and the Fourier transform spectrum curve of the distorted image data column can be as shown in FIG. 6c, and the upper curve in FIG. 6c is a Fourier transform spectrum curve of the image data column shown by the dashed line in the upper reference marker image in FIG. 6a, and the lower curve in FIG. 6c is a Fourier transform spectrum curve of the image data column shown by the dashed line in the lower distortion marker image in FIG. 6a. The corresponding wave peak fitting schematic diagram can be as shown in FIG. 6d, the upper wave peak schematic diagram in FIG. 6d is a fitting schematic diagram of the wave peak in the region shown by the small box in the upper curve in FIG. 6c, and accordingly, the peak value position of the wave peak is a reference marker frequency $f_{ref}(x)$; the lower wave peak schematic diagram in FIG. 6d is a fitting schematic diagram of the wave peak in the region shown by the small box in the lower curve in FIG. 6c, and accordingly, the peak value position of the wave peak is a distortion marker frequency $f_{distorted}(x)$.

Step 503, the ratio between the distortion marker frequency and the reference marker frequency is taken as a stretching coefficient of the distorted image data column relative to the reference image data column.

For the reference image data column and the corresponding distorted image data column thereof shown in FIG. 6a, the stretching coefficient of the distorted image data column relative to the reference image data column is: $S(x)=f_{distorted}(x)/f_{ref}(x)$.

Step 504, the stretching coefficient is utilized to correct the distorted image data column, the corrected distorted image data column in a preset direction is successively displaced according to a preset displacement interval, a relevance value between the distorted image data column and the reference image data column after each displacement is calculated, and the displacement amount corresponding to the maximum relevance value is taken as a displacement coefficient of the distorted image data column relative to the reference image data column.

Corresponding to $S(x)$ in step 503, a corresponding $T(x)$ can be obtained.

Step 505, after calculating stretching coefficients and displacement coefficients corresponding to a plurality of distorted image data columns, linear fitting and extrapolation are respectively performed on a plurality of stretching coefficients and a plurality of displacement coefficients to obtain the stretching coefficient and the displacement coefficient corresponding to each distorted image data column of the entire distortion marker image, as a stretching coefficient and a displacement coefficient corresponding to each image data column of the diffusion-weighted echo planar image.

Considering particular implementation, since noise necessarily exists in the image, the calculation of the distortion coefficient will necessarily introduce some errors, and the stretching coefficient and displacement coefficient obtained through calculation are inaccurate; if these distortion coefficients are directly used to correct corresponding image data columns of a DW-EPI image, the results would be poor. Considering that the distribution of the eddy current field in the entire imaging space is linear, the stretching coefficient and displacement coefficient of each column should also satisfy a linear relationship, and therefore, the least square method can be used to fit $S(x)$ and $T(x)$, and then they can be extrapolated to all the image data columns in the image to obtain the resultant $S_{fit}(x)$ and $T_{fit}(x)$ after fitting and extrapolation so as to reduce errors.

Then, a pixel displacement graph can be calculated according to the following method:

$$PSM(x,y)=y \cdot S_{fit}(x)+T_{fit}(x) \quad (7)$$

After the pixel displacement graph is obtained, the DW-EPI image with distortion can be corrected to obtain an image calibrated to the DW-EPI image with the b value being 0.

The method for correcting image distortion in DW-EPI imaging in the embodiments of the present invention has been described in detail hereinabove, and a system for correcting image distortion for DW-EPI imaging used to implement the method in the embodiments of the present invention will be described in detail hereinafter.

Figure 7:
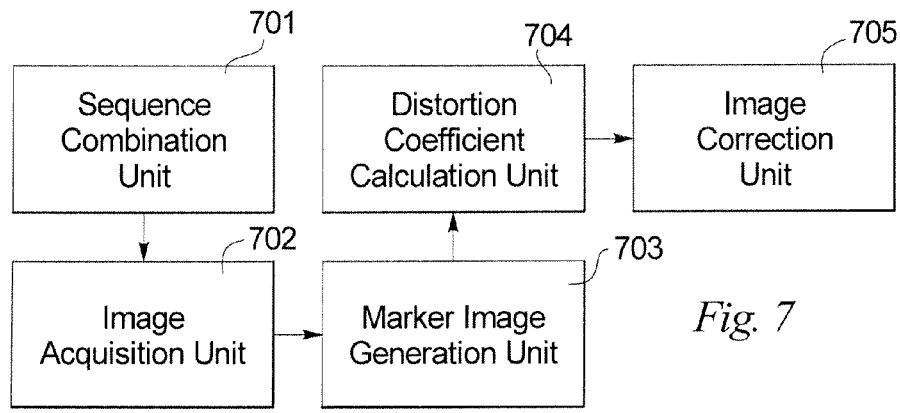
FIG. 7 is a schematic structural diagram of the system for correcting image distortion in DW-EPI imaging in the embodiments of the present invention.

FIG. 7 is a schematic structural diagram of a system for correcting image distortion in DW-EPI imaging in the embodiments of the present invention. As shown in FIG. 7, the system can include: a sequence combination unit 701, an image acquisition unit 702, a marker image generation unit 703, a distortion coefficient calculation unit 704 and an image correction unit 705.

The sequence combination unit 701 is used for applying a marker sequence before a diffusion-weighted echo planar imaging sequence so that they construct a combined sequence.

The image acquisition unit 702 is used for utilizing the combined sequence for acquisition to obtain a plurality of marked images with different preset b values and different preset diffusion directions; and utilizing the DW-EPI sequence for acquisition to obtain a plurality of DW-EPI images having the same b values and diffusion directions as the marked images.

The marker image generation unit 703 is used for subtracting each of the marked images from the diffusion-weighted echo planar images having the same b values and diffusion directions to obtain a marker image corresponding to each of the diffusion-weighted echo planar images, wherein a marker image with the b value being zero is a reference marker image, and a marker image with the b value not being zero is a distortion marker image.

The distortion coefficient calculation unit 704 is used for, regarding each of diffusion-weighted echo planar images with the b value not being zero, utilizing a distortion marker image with the same b value and the same diffusion direction as the current diffusion-weighted echo planar image and a reference marker image corresponding to the current diffusion-weighted echo planar image to calculate a stretching coefficient and a displacement coefficient corresponding to each image data column of the current diffusion-weighted echo planar image.

The image correction unit 705 is used for utilizing the stretching coefficient and displacement coefficient corresponding to each image data column of the current diffusion-weighted echo planar image obtained by the distortion coefficient calculation unit to correct the current diffusion-weighted echo planar image.

Figure 8:
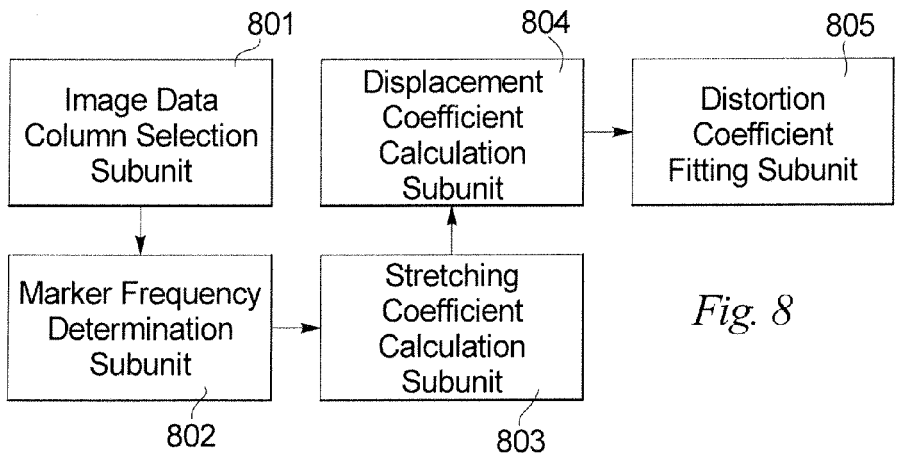
FIG. 8 is a schematic structural diagram of the distortion coefficient calculation unit as shown in FIG. 7.

In particular implementation, the distortion coefficient calculation unit 704 can have a number of particular implementations, and FIG. 8 shows one implementation thereof. As shown in FIG. 8, the distortion coefficient calculation unit 704 can include an image data column selection subunit 801, a marker frequency determination subunit 802, a stretching coefficient calculation subunit 803, a displacement coefficient calculation subunit 804 and a distortion coefficient fitting subunit 805.

The image data column selection subunit 801 is used for selecting a plurality of distorted image data columns from the distortion marker image corresponding to the current diffusion-weighted echo planar image, and for each of the distorted image data columns selected, selecting a reference image data column in a corresponding position from the reference marker image; or, selecting a plurality of reference image data columns from the reference marker image, and for each of the selected reference image data columns, selecting a distorted image data column in a corresponding position from the distortion marker image.

The marker frequency determination subunit 802 is used for, regarding the current reference image data column selected by the image data column selection subunit and the corresponding current distorted image data column thereof, determining the position of a wave peak immediately adjacent to one side of the highest peak in a Fourier transform spectrum curve of the current reference image data column, performing position fitting on the wave peak, and taking the peak value position of the fitted wave peak as a reference marker frequency; and determining the position of a wave peak immediately adjacent to one side of the highest peak in a Fourier transform spectrum curve of the current distorted image data column, performing position fitting on the wave peak, and taking the peak value position of the fitted wave peak as a distortion marker frequency.

The stretching coefficient calculation subunit 803 is used for taking the ratio between the distortion marker frequency and the reference marker frequency determined by the marker frequency determination subunit as a stretching coefficient of the current distorted image data column relative to the current reference image data column.

The displacement coefficient calculation subunit 804 is used for utilizing the stretching coefficient to correct the current distorted image data column, successively displacing the corrected current distorted image data column in a preset direction according to a preset displacement interval, calculating a relevance value between the current distorted image data column and the current reference image data column after each displacement, and taking the displacement amount corresponding to the maximum relevance value as a displacement coefficient of the current distorted image data column relative to the current reference image data column.

The distortion coefficient fitting subunit 805 is used, after the stretching coefficient calculation subunit and the displacement coefficient calculation subunit calculate stretching coefficients and displacement coefficients corresponding to a plurality of distorted image data columns, for respectively performing linear fitting and extrapolation on a plurality of stretching coefficients and a plurality of displacement coefficients to obtain the stretching coefficient and the displacement coefficient corresponding to each distorted image data column of the entire distortion marker image as the stretching coefficient and the displacement coefficient corresponding to each image data column of the diffusion-weighted echo planar image.

In a particular implementation, the image data column selection subunit 801 can successively extract each image data column in the reference marker image, and for the currently extracted image data column, calculate a Fourier transform spectrum curve of the image data column, and if the ratio between the peak value of the highest peak and the peak value of a wave peak on one side of the highest peak in the spectrum curve is greater than a preset selection threshold value, then it can select the currently selected image data column as a reference image data column; or, it can also directly select several image data columns in a middle region in the distortion marker image as distorted image data columns.

In addition, the image data column selection subunit 801 can also successively extract each image data column in the reference marker image, and for the currently extracted image data column, calculate a Fourier transform spectrum curve of the image data column, and if the ratio between the peak value of the highest peak in the spectrum curve and the peak value of a wave peak on one side of the highest peak is greater than a preset selection threshold value, then it can select the currently selected image data column as a reference image data column; or, it can also directly select several image data columns in a middle region in the reference marker image as reference image data columns.

In a particular implementation, the image acquisition unit 702 can be used for realizing the combination of all elements for image acquisition in magnetic resonance imaging equipment, for example, various gradient coils, image acquisition elements and so on can be included. The sequence combination unit 701, any one of or any combination of the marker image generation unit 703, the distortion coefficient calculation unit 704 and the image correction unit 705 can be a hardware circuit, and can also be program code. When any one of or any combination of the sequence combination unit 701, the marker image generation unit 703, the distortion coefficient calculation unit 704 and the image correction unit 705 is program code, the system for correcting image distortion in DW-EPI imaging in the embodiments of the present invention can further include: a processor (not shown in the figure) and a computer readable storage medium (not shown in the figure).

The processor is used for executing the program code in the computer readable storage medium.

Any one of the sequence combination unit 701, the marker image generation unit 703, the distortion coefficient calculation unit 704 and the image correction unit 705 is program code stored in the computer readable storage medium.

The magnetic resonance imaging equipment in the embodiments of the present invention can include a system for correcting image distortion in diffusion-weighted echo planar imaging of any one particular implementation above.

The image distortion correction technology for diffusion-weighted echo planar imaging (DW-EPI) described in the embodiments of the present invention is suitable for all imaging technologies based on DW-EPI sequence, such as diffusion-weighted imaging (DWI), apparent diffusion coefficient calculation (ADC mapping), diffusion tensor imaging (DTI), fiber bundle tracking, and so on.

Two particular examples of the technical solution in the embodiments of the present invention will be listed hereinafter.

Example I

The particular imaging parameters of DW-EPI imaging are: 1.5T magnetic resonance imager, TE/TR=127/500 msec; bandwidth: 1000 Hz; field of view (FoV): 200×200 mm; imaging matrix: 128×128; layer thickness: 1; average passes: 4; the b values used in diffusion imaging are respectively: 0, 500, 1000; diffusion mode: orthogonal; and diffusion method: single polarity.

Most of the particular imaging parameters of a marked image are the same as those of a DW-EPI image, except that the average pass is 1.

FIGS. 9a to 9g show schematic diagrams of distortion correction for an image with b=1000. FIG. 9a is an image with b=0; FIGS. 9b to 9d are images with b=1000 in three different diffusion directions; FIG. 9b is an image in the direction of phase coding, FIG. 9c is an image in the direction of readout, and FIG. 9d is an image in the slice selective direction. FIGS. 9e to 9g are images after correction in each diffusion direction in FIGS. 9b to 9d respectively, wherein FIG. 9e is an image after correction of FIG. 9b, FIG. 9f is an image after correction of FIG. 9c, and FIG. 9g is an image after correction of FIG. 9d.

It can be seen from the comparison of images before and after correction that the edge of the corrected image follows the contour line of the image with b=0 well, which indicates that the solution in the embodiments of the present invention effectively corrects the image distortion caused by the eddy current field.

FIGS. 10a and 10b show isotropic diffusion-weighted images with the b value being 1000 in this example, wherein FIG. 10a is obtained through the calculation of the single DW-EPI images originally collected in FIGS. 9b to 9d, and FIG. 10b is obtained through the calculation of corrected single DW-EPI images in FIGS. 9e to 9g. It can be seen from the enlargement and comparison of the edge regions of the respective lower right boxes that a corrected image can effectively reduce the extent of blur in the isotropic diffusion-weighted image.

FIGS. 11a and 11b show respectively an ADC image generated using a raw isotropic diffusion-weighted image and an ADC image generated using a corrected isotropic diffusion-weighted image in this example, wherein FIG. 11a is an ADC image generated using a raw isotropic diffusion-weighted image, and FIG. 11b is an ADC image generated using a corrected isotropic diffusion-weighted image. It can be seen from the enlargement and comparison of the edge regions of the lower rectangular boxes that since the image distortion caused by the eddy current is effectively corrected, the ADC image generated using a corrected isotropic diffusion-weighted image is more accurate.

Example II

The particular imaging parameters of DW-EPI imaging are: 3T magnetic resonance imager, TE/TR=108/5900 msec; bandwidth: 1040 Hz; field of view (FoV): 235×235 mm; imaging matrix: 192×192; layer thickness: 25; average passes: 4; the b values used in diffusion image are respectively: 0, 1000; diffusion mode: orthogonal; and diffusion method: single polarity.

Most of the particular imaging parameters of a marked image are the same as those of a DW-EPI image, except that the average pass is 1.

FIGS. 12a to 12g show results of distortion correction for an image with b=1000. FIG. 12a is an image with b=0; FIGS. 12b to 12d are images with b=1000 in three different diffusion directions; FIG. 12b is an image in the direction of phase coding, FIG. 12c is an image in the direction of readout, and FIG. 12d is an image in the slice selective direction. FIGS. 12e to 12g are images after correction in each diffusion direction in FIGS. 12b to 12d respectively, wherein FIG. 12e is an image after correction of FIG. 12b, FIG. 12f is an image after correction of FIG. 12c, and FIG. 12g is an image after correction of FIG. 12d.

It can be seen from the comparison of images before and after correction that the edge of a corrected image follows the contour line of the image with b=0 well, which indicates that the solution in the embodiments of the present invention effectively corrects the image distortion caused by the eddy current field.

It can be seen from the comparison of images before and after correction that the edge of a corrected image follows the contour line of the image with b=0 well, which indicates that the solution in the embodiments of the present invention effectively corrects the image distortion caused by the eddy current field.

The present invention relates to diffusion-weighted echo planar imaging in magnetic resonance imaging. Disclosed is a method for correcting image distortion, including: applying a marker sequence before a diffusion-weighted echo planar imaging sequence to construct a combined sequence; utilizing the combined sequence for acquisition to obtain a plurality of marked images with different preset b values and different preset diffusion directions; utilizing the diffusion-weighted echo planar imaging sequence for acquisition to obtain a plurality of diffusion-weighted echo planar images with the same b values and diffusion directions as the marked images; calculating a stretching coefficient and a displacement coefficient corresponding to each image data column of the diffusion-weighted echo planar image, and utilizing the stretching coefficient and displacement coefficient to correct the diffusion-weighted echo planar image. Also disclosed in the present invention are a system for correcting image distortion in diffusion-weighted echo planar imaging and magnetic resonance imaging equipment having such a system. The present invention can effectively correct the image distortion introduced by eddy current.

What are described above are merely preferred embodiments of the present invention which are not intended to limit the present invention, and any modifications, equivalents and improvements within the spirit and principle of the present invention should be covered by the protection scope of the present invention.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for correcting image distortion in diffusion-weighted echo planar imaging, comprising:
   utilizing a combined sequence for acquisition to obtain a plurality of marked images with different preset b values and different preset diffusion directions, wherein the combined sequence comprises a diffusion-weighted echo planar imaging sequence and a marker sequence applied before the same; and utilizing the diffusion-weighted echo planar imaging sequence for acquisition to obtain a plurality of diffusion-weighted echo planar images with the same b values and diffusion directions as the marked images;
   subtracting each of the marked images from the diffusion-weighted echo planar image having the same b values and the same diffusion directions to obtain a marker image corresponding to each of the diffusion-weighted echo planar images, wherein a marker image with the b value being zero is a reference marker image, and a marker image with the b value not being zero is a distortion marker image; and
   for each diffusion-weighted echo planar image with the b value not being zero, utilizing the distortion marker image having the same b value and the same diffusion direction as the diffusion-weighted echo planar image and a reference marker image corresponding to the diffusion-weighted echo planar image to calculate a stretching coefficient and a displacement coefficient corresponding to each image data column of the diffusion-weighted echo planar image, and utilizing the stretching coefficient and displacement coefficient to correct the diffusion-weighted echo planar image.

2. The method as claimed in claim 1, wherein calculating a stretching coefficient and a displacement coefficient corresponding to each image data column of the diffusion-weighted echo planar image comprises:

selecting a plurality of distorted image data columns from the distortion marker image, and for each of the distorted image data columns selected, selecting a reference image data column in a corresponding position from the reference marker image; or, selecting a plurality of reference image data columns from the reference marker image, and for each of the selected reference image data columns, selecting a distorted image data column in a corresponding position from the distortion marker image;

for the currently selected reference image data column and the corresponding distorted image data column thereof, determining the position of a wave peak immediately adjacent to one side of the highest peak in a Fourier transform spectrum curve of the reference image data column, performing position fitting on the wave peak, and taking the peak value position of the fitted wave peak as a reference marker frequency; and determining the position of a wave peak immediately adjacent to one side of the highest peak in the Fourier transform spectrum curve of the distorted image data column, performing position fitting on the wave peak, and taking the peak value position of the fitted wave peak as a distortion marker frequency;

taking the ratio between the distortion marker frequency and the reference marker frequency as the stretching coefficient of the current distorted image data column relative to the current reference image data column;

utilizing the stretching coefficient to correct the distorted image data column, successively displacing the corrected distorted image data column in a preset direction according to a preset displacement interval, calculating a relevance value between the distorted image data column and the reference image data column after each displacement, and taking the displacement amount corresponding to the maximum relevance value as the displacement coefficient of the distorted image data column relative to the reference image data column; and after calculation of the stretching coefficients and displacement coefficients corresponding to a plurality of distorted image data columns, respectively performing linear fitting and extrapolation on a plurality of stretching coefficients and a plurality of displacement coefficients to obtain the stretching coefficient and the displacement coefficient corresponding to each distorted image data column of the entire distortion marker image, as the stretching coefficient and the displacement coefficient corresponding to each image data column of the diffusion-weighted echo planar image.

3. The method as claimed in claim 2, wherein:

selecting a plurality of distorted image data columns from the distortion marker image comprises: successively extracting each image data column in the distortion marker image, for the currently extracted image data column, calculating a Fourier transform spectrum curve of the image data column, and if the ratio between the peak value of the highest peak and the peak value of a wave peak on one side of the highest peak in the spectrum curve is greater than a preset selection threshold value, then selecting the currently extracted image data column as a distorted image data column; and selecting a plurality of reference image data columns from the reference marker image comprises: successively extracting each image data column in the reference marker image, for the currently extracted image data column, calculating a Fourier transform spectrum curve of the image data column, and if the ratio between the peak value of the highest peak and the peak value of a wave peak on one side of the highest peak in the spectrum curve is greater than a preset selection threshold value, then selecting the currently extracted image data column as a reference image data column.

4. A magnetic resonance system for correcting image distortion in diffusion-weighted echo planar imaging, comprising:

a magnetic resonance data image acquisition unit for utilizing a combined sequence for acquisition to obtain a plurality of marked images with different preset b values and different preset diffusion directions, wherein the combined sequence comprises a diffusion-weighted echo planar imaging sequence and a marker sequence applied before the same; and utilizing the diffusion-weighted echo planar imaging sequence for acquisition to obtain a plurality of diffusion-weighted echo planar images with the same b values and diffusion directions as the marked images;

a marker image generation unit for subtracting each of the marked images from the diffusion-weighted echo planar images having the same b values and the same diffusion directions to obtain a marker image corresponding to each of the diffusion-weighted echo planar images, wherein a marker image with the b value being zero is a reference marker image, and a marked image with the b value not being zero is a distortion marker image;

a distortion coefficient calculation unit for, regarding a current diffusion-weighted echo planar image in the diffusion-weighted echo planar images with the b value not being zero, utilizing a distortion marker image having the same b value and the same diffusion direction as the current diffusion-weighted echo planar image and a reference marker image corresponding to the current diffusion-weighted echo planar image to calculate a stretching coefficient and a displacement coefficient corresponding to each image data column of the current diffusion-weighted echo planar image; and an image correction unit for utilizing the stretching coefficient and displacement coefficient corresponding to each image data column of the current diffusion-weighted echo planar image obtained by the distortion coefficient calculation unit to correct the current diffusion-weighted echo planar image.

5. The system as claimed in claim 4, wherein the distortion coefficient calculation unit comprises:

an image data column selection subunit for selecting a plurality of distorted image data columns from the distortion marker image corresponding to the current diffusion-weighted echo planar image, and, for each of the distorted image data columns selected, selecting a reference image data column in a corresponding position from the reference marker image; or, selecting a plurality of reference image data columns from the reference marker image, and for each of the selected reference image data columns, selecting a distorted image data column in a corresponding position from the distortion marker image;

a marker frequency determination subunit for, regarding the current reference image data column selected by the image data column selection subunit and the corresponding current distorted image data column thereof, determining the position of a wave peak immediately adjacent to one side of the highest peak in a Fourier transform spectrum curve of the current reference image data column, performing position fitting on the wave peak, and taking the peak value position of the fitted wave peak as a reference marker frequency; and determining the position of a wave peak immediately adjacent to one side of the highest peak in a Fourier transform spectrum curve of the current distorted image data column, performing position fitting on the wave peak, and taking the peak value position of the fitted wave peak as a distortion marker frequency;

a stretching coefficient calculation subunit for taking the ratio between the distortion marker frequency and the reference marker frequency determined by the marked frequency determination subunit as a stretching coefficient of the current distorted image data column relative to the current reference image data column;

a displacement coefficient calculation subunit for utilizing the stretching coefficient to correct the current distorted image data column, successively displacing the corrected current distorted image data column in a preset direction according to a preset displacement interval, calculating a relevance value between the current distorted image data column and the current reference image data column after each displacement, and taking the displacement amount corresponding to the maximum relevance value as a displacement coefficient of the current distorted image data column relative to the current reference image data column; and a distortion coefficient fitting subunit for, after the stretching coefficient calculation subunit and the displacement coefficient calculation subunit calculate obtain the stretching coefficients and displacement coefficients corresponding to a plurality of distorted image data columns, respectively performing linear fitting and extrapolation on a plurality of stretching coefficients and a plurality of displacement coefficients to obtain the stretching coefficient and the displacement coefficient corresponding to each distorted image data column of the entire distortion marker image, as a stretching coefficient and a displacement coefficient corresponding to each image data column of the diffusion-weighted echo planar image.

6. The system as claimed in claim 5, wherein:

the image data column selection subunit successively extracts each image data column in the distortion marker image, and for the currently extracted image data column, calculates to obtain a Fourier transform spectrum curve of the image data column, and if the ratio between the peak value of the highest peak and the peak value of a wave peak on one side of the highest peak in the spectrum curve is greater than a preset selection threshold value, then selects the currently extracted image data column as a distorted image data column; and the image data column selection subunit successively extracts each image data column in the reference marker image, and for the currently extracted image data column, calculates to obtain a Fourier transform spectrum curve of the image data column, and if the ratio between the peak value of the highest peak and the peak value of a wave peak on one side of the highest peak in the spectrum curve is greater than a preset selection threshold value, then selects the currently extracted image data column as a reference image data column.

7. The system as claimed in claim 4, comprising: a sequence combination unit for applying a marker sequence before a diffusion-weighted echo planar imaging sequence to construct a combined sequence.

8. A non-transitory, computer-readable data storage medium encoded with programming instructions, said data storage medium being loadable into a computerized control and evaluation system of a magnetic resonance system, said magnetic resonance system comprising a magnetic resonance data acquisition unit, and said control instructions causing said computerized control and evaluation system to:

utilize a combined sequence for acquisition to obtain a plurality of marked images with different preset b values and different preset diffusion directions, wherein the combined sequence comprises a diffusion-weighted echo planar imaging sequence and a marker sequence applied before the same; and utilizing the diffusion-weighted echo planar imaging sequence for acquisition to obtain a plurality of diffusion-weighted echo planar images with the same b values and diffusion directions as the marked images;

subtract each of the marked images from the diffusion-weighted echo planar image having the same b values and the same diffusion directions to obtain a marker image corresponding to each of the diffusion-weighted echo planar images, wherein a marker image with the b value being zero is a reference marker image, and a marker image with the b value not being zero is a distortion marker image; and for each diffusion-weighted echo planar image with the b value not being zero, utilize the distortion marker image having the same b value and the same diffusion direction as the diffusion-weighted echo planar image and a reference marker image corresponding to the diffusion-weighted echo planar image to calculate a stretching coefficient and a displacement coefficient corresponding to each image data column of the diffusion-weighted echo planar image, and utilizing the stretching coefficient and displacement coefficient to correct the diffusion-weighted echo planar image.

* * * * *